(12) United States Patent
Kamo et al.

(10) Patent No.: US 9,599,909 B2
(45) Date of Patent: Mar. 21, 2017

(54) ELECTROSTATIC CHUCK CLEANER, CLEANING METHOD, AND EXPOSURE APPARATUS

(71) Applicant: KABUSHIKI KAISHA TOSHIBA, Tokyo (JP)

(72) Inventors: Takashi Kamo, Yokohama Kanagawa (JP); Yoshihito Kobayashi, Hino Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 14/466,250

(22) Filed: Aug. 22, 2014

(65) Prior Publication Data
US 2015/0261104 A1  Sep. 17, 2015

(30) Foreign Application Priority Data

Mar. 13, 2014 (JP) ................................. 2014-050861

(51) Int. Cl.
*G03F 7/20* (2006.01)

(52) U.S. Cl.
CPC ...... *G03F 7/70708* (2013.01); *G03F 7/70925* (2013.01)

(58) Field of Classification Search
CPC .................... G03F 7/70708; G03F 7/70925
See application file for complete search history.

(56) References Cited

U.S. PATENT DOCUMENTS

| | | | |
|---|---|---|---|
| 2006/0162739 A1* | 7/2006 | Sogard | B08B 7/0014 134/1 |
| 2008/0257383 A1* | 10/2008 | Levinson | H01L 21/67028 134/6 |
| 2009/0250077 A1* | 10/2009 | Harano | B08B 6/00 134/1 |
| 2011/0037960 A1* | 2/2011 | Scaccabarozzi | G03F 7/70925 355/30 |
| 2011/0159440 A1 | 6/2011 | Nakajima et al. | |
| 2011/0266140 A1* | 11/2011 | Kinoshita | G03F 1/24 204/192.27 |
| 2012/0024318 A1* | 2/2012 | Itoh | B08B 7/0028 134/6 |

(Continued)

FOREIGN PATENT DOCUMENTS

| | | |
|---|---|---|
| JP | 2006-13308 | 1/2006 |
| JP | 2006-229122 | 8/2006 |

*Primary Examiner* — Steven H Whitesell Gordon
(74) *Attorney, Agent, or Firm* — Finnegan, Henderson, Farabow, Garrett & Dunner LLP

(57) ABSTRACT

According to one embodiment, an electrostatic chuck cleaner cleaning an adsorption face of an electrostatic chuck capable of attracting a reticle, and the cleaner includes: a plurality of substrates; adhesive layers provided on a major surface of each of the substrates, the adhesive layers being pressed against the adsorption face; and conductive layers provided on the major surface of each of the substrates, and the conductive layers being provided in a region other than a region where the adhesive layer being provided. The adhesive layers provided on the major surface of each of the substrates are disposed in different regions, and the entire adsorption face is pressed by the adhesive layers when the adhesive layers of the substrates are pressed against the adsorption face.

17 Claims, 8 Drawing Sheets

(56) References Cited

U.S. PATENT DOCUMENTS

| | | | |
|---|---|---|---|
| 2013/0247935 A1* | 9/2013 | Park | G03F 7/70925 134/1 |
| 2014/0226136 A1* | 8/2014 | Gagnon | G03F 1/82 355/30 |
| 2014/0326278 A1* | 11/2014 | Kobayashi | B08B 7/0014 134/6 |
| 2015/0107621 A1* | 4/2015 | Kobayashi | G03F 7/70925 134/6 |

* cited by examiner

ELECTROSTATIC CHUCK CLEANER, CLEANING METHOD, AND EXPOSURE APPARATUS

CROSS-REFERENCE TO RELATED APPLICATIONS

This application is based upon and claims the benefit of priority from Japanese Patent Application No. 2014-050861, filed on Mar. 13, 2014; the entire contents of which are incorporated herein by reference.

FIELD

Embodiments described herein relate generally to an electrostatic chuck cleaner, a cleaning method, and an exposure apparatus.

BACKGROUND

In an exposure apparatus that uses EUV light, since the wavelength of the EUV light is as short as 13.5 nm and is attenuated in the atmosphere, an exposure optical system is provided in a vacuum. Since a reticle stage is placed in the vacuum, a vacuum chuck cannot be used for an EUV mask namely, and instead, an electrostatic chuck system is adopted.

However, when the reticle is adsorbed to an electrostatic chuck, if foreign matters are present between the reticle and the electrostatic chuck, the reticle is deformed and a pattern transferred onto a wafer is distorted.

DETAILED DESCRIPTION

Figure 1:
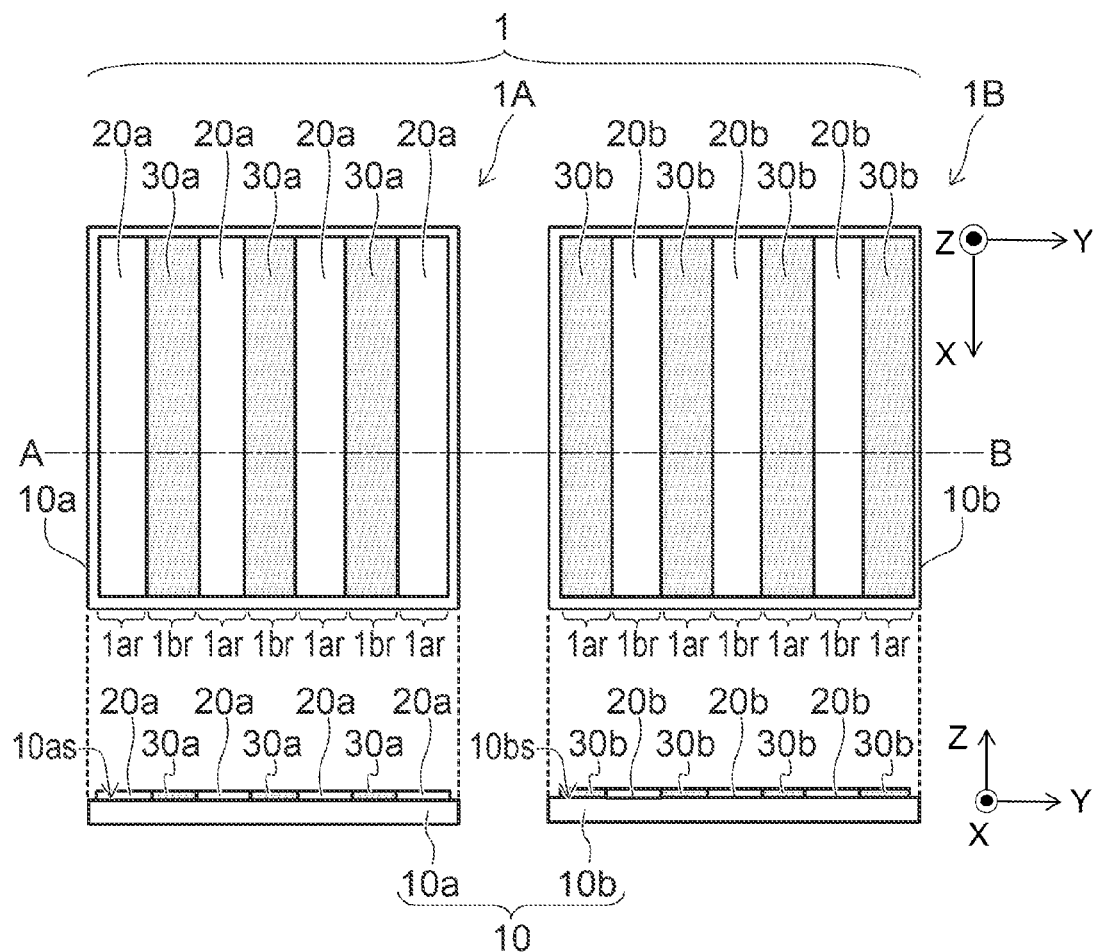
FIG. 1 is a schematic plan view and a schematic sectional view showing an electrostatic chuck cleaner according to a first embodiment.

According to one embodiment, an electrostatic chuck cleaner cleaning an adsorption face of an electrostatic chuck capable of attracting a reticle, and the cleaner includes: a plurality of substrates; adhesive layers provided on a major surface of each of the substrates, the adhesive layers being pressed against the adsorption face; and conductive layers provided on the major surface of each of the substrates, and the conductive layers being provided in a region other than a region where the adhesive layer being provided. The adhesive layers provided on the major surface of each of the substrates are disposed in different regions, and the entire adsorption face is pressed by the adhesive layers when the adhesive layers of the substrates are pressed against the adsorption face.

Embodiments are described below with reference to the drawings. In the following description, the same members are denoted by the same reference numerals and signs. Description of members once described is omitted as appropriate.

First Embodiment

FIG. 1 is a schematic plan view and a schematic sectional view showing an electrostatic chuck cleaner according to a first embodiment.

In FIG. 1, an electrostatic chuck cleaner 1 (a pair of electrostatic chuck cleaners 1A and 1B) is shown. In FIG. 1, a schematic plane of the electrostatic chuck cleaner 1 is shown in an upper part of FIG. 1. A schematic cross section of the electrostatic chuck cleaner 1 is shown in a lower part of FIG. 1. In the sectional view, a cross section in a position along an A-B line of the plan view is shown.

The electrostatic chuck cleaner 1 is a cleaner that can clean an adsorption face of an electrostatic chuck. The electrostatic chuck cleaner 1 can press an adhesive layer against foreign matters, dust, and the like adhering to the adsorption face of the electrostatic chuck and remove the foreign matters, the dust, and the like from the adsorption face of the electrostatic chuck. The electrostatic chuck is an electrostatic chuck capable of attracting a reticle used in an exposure process.

As shown in FIG. 1, the electrostatic chuck cleaner 1 includes the pair of electrostatic chuck cleaners 1A and 1B. For example, the electrostatic chuck cleaner 1 includes a substrate 10 (a pair of substrates 10a and 10b). The substrate 10 is, for example, a substrate same as a reticle actually conveyed into an exposure apparatus and used.

One electrostatic chuck cleaner 1A of the electrostatic chuck cleaner 1 is described.

In one substrate 10a of the substrate 10, first adhesive layer sections 20a are provided in first regions 1ar of a major surface 10as thereof. First conductive layer sections 30a are provided in second regions 1br other than the first regions 1ar of the major surface 10as.

When the major surface 10as is viewed from a direction perpendicular to the major surface 10as of the substrate 10a (a Z-direction), the first adhesive layer sections 20a and the first conductive layer sections 30a extend in an X-direction (a first direction). The first adhesive layer sections 20a and the first conductive layer sections 30a are alternately arrayed in a Y-direction (a second direction) that crosses the X-direction.

The other electrostatic chuck cleaner 1B of the electrostatic chuck cleaner 1 is described.

In the other substrate 10b of the substrate 10, second conductive layer sections 30b are provided in the first regions 1ar of a major surface 10bs thereof. Second adhesive layer sections 20b are provided in the second regions 1br other than the first regions 1ar of the major surface 10bs.

When the major surface 10bs is viewed from a direction perpendicular to the major surface 10bs of the substrate 10b, the second adhesive layer sections 20b and the second conductive layer sections 30b extend in the X-direction. The second adhesive layer sections 20b and the second conductive layer sections 30b are alternately arrayed in the Y-direction.

The substrate 10 includes, for example, quartz, glass, ceramic, or metal. The first conductive layer sections 30a and the second conductive layer sections 30b include, for example, chrome (Cr). The first conductive layer sections 30a and the second conductive layer sections 30b may be formed, for example, when a light blocking film (a Cr containing film) of a reticle is formed. The first adhesive layer sections 20a and the second adhesive layer sections 20b include, as an example, an acrylic acid ester copolymer. However, the first adhesive layer sections 20a and the second adhesive layer sections 20b are not limited to this example. The first adhesive layer sections 20a and the second adhesive layer sections 20b are formed by, for example, screen printing.

In the embodiment, the first adhesive layer sections 20a and the second adhesive layer sections 20b are collectively referred to as adhesive layers 20. The first conductive layer sections 30a and the second conductive layer sections 30b are collectively referred to as conductive layers 30.

As described above, the substrate 10 is the substrate same as the reticle actually conveyed into the exposure apparatus and used. Therefore, in an electrostatic chuck sequence of the exposure apparatus, the electrostatic chuck cleaner 1 can be adsorbed to the electrostatic chuck as well.

A method of cleaning the adsorption face of the electrostatic chuck using the electrostatic chuck cleaner 1 according to the electrostatic chuck sequence of the exposure apparatus is described below.

FIGS. 2A to 2H are schematic sectional views showing a cleaning method according to the first embodiment.

In FIGS. 2A to 2H, a state of the inside of the exposure apparatus (an EUV exposure apparatus) is shown.

First, the adsorption face of the electrostatic chuck is cleaned using the electrostatic chuck cleaner 1A of the electrostatic chuck cleaner 1.

The electrostatic chuck cleaner 1A of the electrostatic chuck cleaner 1 is housed in a pod for conveyance of the exposure apparatus in advance, placed on a base plate described below, and conveyed into the exposure apparatus.

Figure 2A:
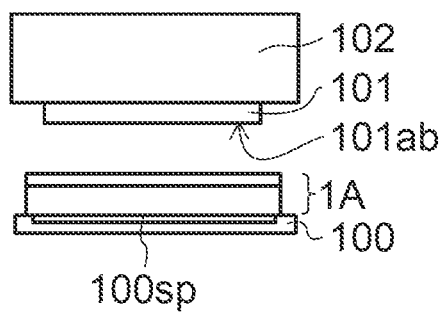
FIGS. 2A to 2H are schematic sectional views showing a cleaning method according to the first embodiment.

First, as shown in FIG. 2A, a base plate 100, which supports the electrostatic chuck cleaner 1A, is located under an electrostatic chuck 101. A gap 100sp is present between the electrostatic chuck cleaner 1A and the base plate 100. This is because the base plate 100 supports an actual reticle besides the electrostatic chuck cleaner 1. That is, in the actual reticle, a pattern is formed in a major surface on the base plate 100 side. The gap 100sp is provided to prevent direct contact of the pattern and the base plate 100.

The electrostatic chuck 101 is supported by a stage 102. A surface of the electrostatic chuck 101 on the base plate 100 side is an adsorption face 101ab that attracts the reticle.

Figure 2E:
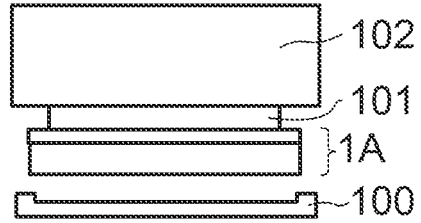
Figure 2B:
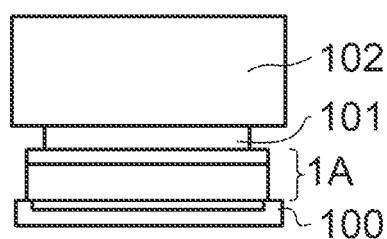

Subsequently, as shown in FIG. 2B, the base plate 100 is lifted toward the electrostatic chuck 101. When a pressure sensor for sensing contact of the electrostatic chuck 101 and the electrostatic chuck cleaner 1A reaches a fixed value, the lift of the base plate 100 is stopped.

Figure 2F:
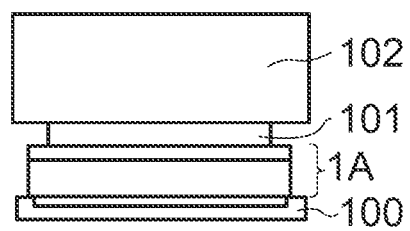
Figure 2C:
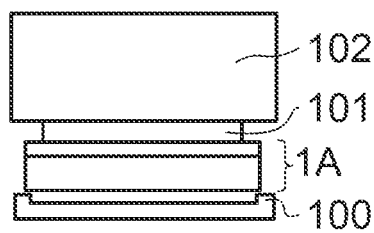

As shown in FIG. 2C, a voltage is applied to the electrostatic chuck 101 to attract the first conductive layer sections 30a of the electrostatic chuck cleaner 1A. According to the attraction, the first adhesive layer sections 20a of the electrostatic chuck cleaner 1A are pressed against the adsorption face 101ab of the electrostatic chuck 101.

Figure 2G:
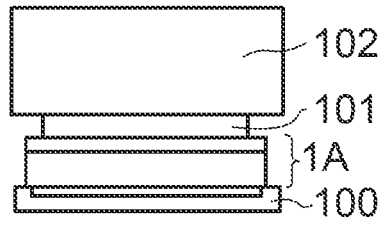
Figure 2D:
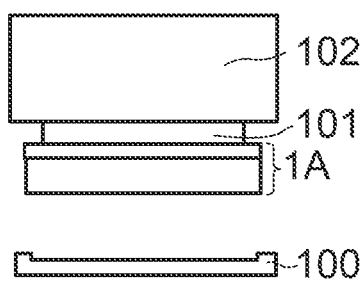

As shown in FIG. 2D, the base plate 100 is lowered. In this state, the electrostatic chuck cleaner 1A is adsorbed by the electrostatic chuck 101.

As shown in FIG. 2E, the base plate 100 is located under the electrostatic chuck cleaner 1A.

As shown in FIG. 2F, the base plate 100 is lifted toward the electrostatic chuck 101. When the pressure sensor for sensing the contact of the base plate 100 and the electrostatic chuck cleaner 1A reaches the fixed value, the lift of the base plate 100 is stopped.

As shown in FIG. 2G, the voltage application to the electrostatic chuck 101 is stopped.

Figure 2H:
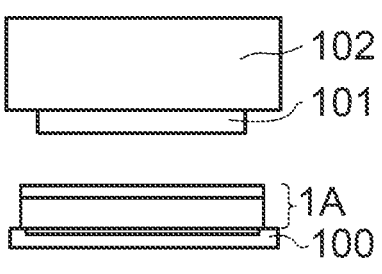

As shown in FIG. 2H, the base plate 100 is lowered. When the base plate 100 is lowered, the electrostatic chuck cleaner 1A separates from the electrostatic chuck 101 with the own weight of the electrostatic chuck cleaner 1A. The electrostatic chuck cleaner 1A descends together with the base plate 100 while being supported by the base plate 100.

Thereafter, the electrostatic chuck cleaner 1A supported by the base plate 100 is carried out from the exposure apparatus and housed in the pod for conveyance of the exposure apparatus.

Subsequently, the electrostatic chuck sequence shown in FIGS. 2A to 2H is performed again using the electrostatic chuck cleaner 1B.

Figure 3A:
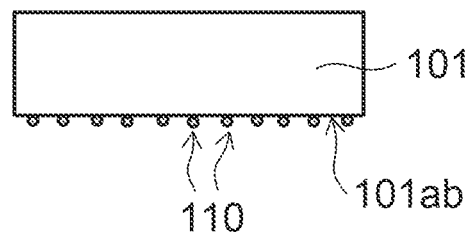
FIGS. 3A to 3C are schematic sectional views showing a state in which foreign matters are removed from the electrostatic chuck adsorption face in the cleaning method according to the first embodiment.
Figure 3B:
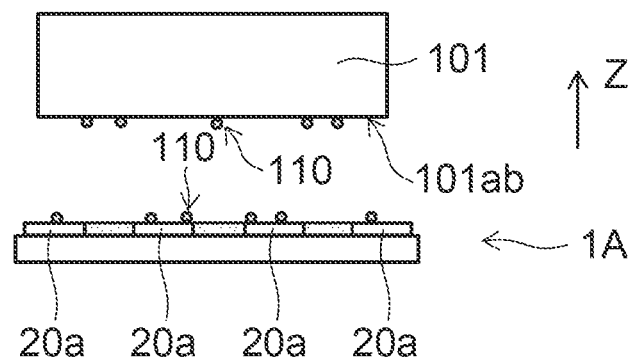
Figure 3C:
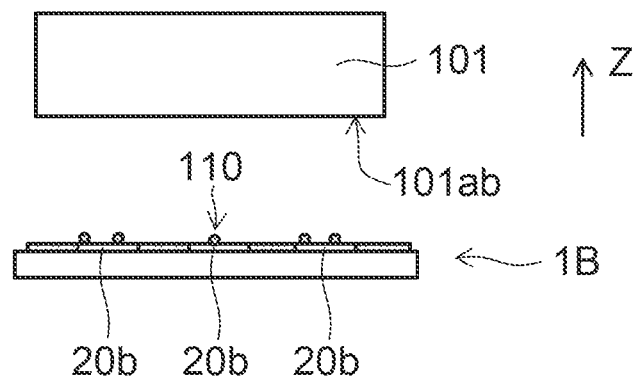

FIGS. 3A to 3C are schematic sectional views showing a state in which foreign matters are removed from the electrostatic chuck adsorption face in the cleaning method according to the first embodiment.

As shown in FIG. 3A, before cleaning, a plurality of foreign matters 110 adhere to the adsorption face 101ab of the electrostatic chuck 101.

The electrostatic chuck cleaner 1A is pressed against and released from the adsorption face 101ab, whereby, as shown in FIG. 3B, a part of the plurality of foreign matters 110 is removed by the first adhesive layer sections 20a of the electrostatic chuck cleaner 1A.

Subsequently, the electrostatic chuck cleaner 1B is pressed against and released from the adsorption face 101ab, whereby, as shown in FIG. 3C, the remaining all foreign matters 110 are removed by the second adhesive layer section 20b of the electrostatic chuck cleaner 1B.

In this way, the electrostatic chuck cleaners 1A and 1B, formation regions of the adhesive layers 20 of which are different from each other, are used. The electrostatic chuck cleaners 1A and 1B are adsorbed to the adsorption face 101ab of the electrostatic chuck 101. When the electrostatic chuck cleaner 1A and the electrostatic chuck cleaner 1B are superimposed in the Z-direction, the entire region of the adsorption face 101ab of the electrostatic chuck 101 is covered by the first adhesive layer sections 20a and the second adhesive layer sections 20b. Therefore, the foreign matters 110 adhering to the adsorption face 10 1ab of the electrostatic chuck 101 are efficiently removed over the entire region of the adsorption face 101ab.

As long as the entire adsorption face of the electrostatic chuck is covered by adhesive layers of each of a plurality of electrostatic chuck cleaners, the electrostatic chuck cleaner does not need to be a pair of the electrostatic chuck cleaners. For example, the electrostatic chuck cleaner may include three or more substrates 10. In this case, the electrostatic chuck cleaner includes the adhesive layers 20 provided on the major surface of each of the plurality of substrates 10 and the conductive layers 30 provided on the major surface of each of the plurality of substrates 10 and provided in regions other than regions where the adhesive layers 20 are provided.

The adhesive layers 20 provided on the major surface of each of the plurality of substrates 10 are disposed in different regions. When the adhesive layer 20 side of each of the plurality of substrates 10 is pressed against the adsorption face 101ab, the entire adsorption face 101ab is pressed by the adhesive layers 20. That is, when the adhesive layers 20 of each of the plurality of substrates 10 are pressed against the adsorption face of the electrostatic chuck one by one, the entire adsorption face comes into contact with the adsorption faces.

As described above, in the EUV exposure, the electrostatic chuck system is adopted for the chuck mechanism of the reticle. To obtain a retaining force same as the retaining force of the vacuum chuck system using the electrostatic chuck system, an electrostatic chuck region having a wider area is necessary.

Therefore, in the reticle for EUV, in some case, most of the rear surface thereof is formed as the electrostatic chuck region. In such a case, every time the reticle for EUV is adsorbed to the electrostatic chuck 101, the entire region of the electrostatic chuck region comes into contact with the adsorption face 101ab of the electrostatic chuck 101. Therefore, the foreign matters 110 easily adhere to the adsorption face 101ab.

The electrostatic chuck mechanism is present in a vacuum. Therefore, to remove foreign matters, it is necessary to open the exposure apparatus to the atmosphere and perform cleaning work. An operating ratio of the EUV exposure decreases because of the opening to the atmosphere.

To prevent the decrease in the operating ratio, there is a method of attaching adhesive layers to an entire region of the rear surface of one electrostatic chuck cleaner and cleaning an adsorption face of an electrostatic chuck without exposing the exposure apparatus to the atmosphere. However, problems described below occur in this method. The problems are described below as a reference example.

Figure 4A:
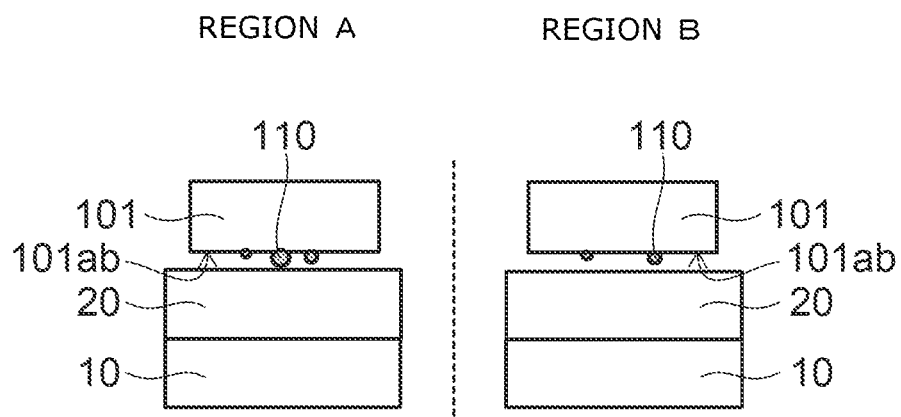
FIGS. 4A to 4C are schematic sectional views showing a cleaning method according to the reference example.
Figure 4B:
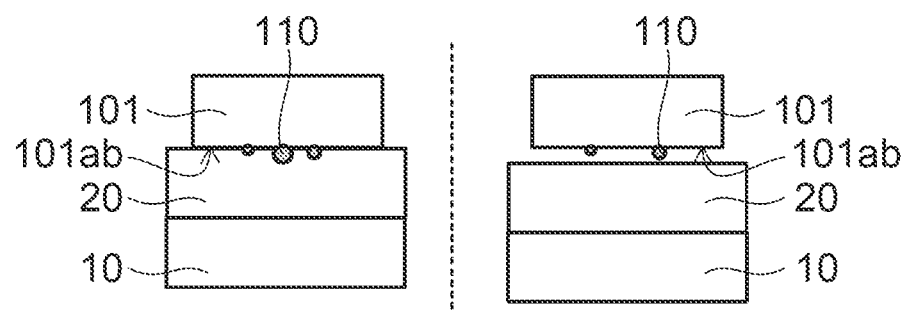
Figure 4C:
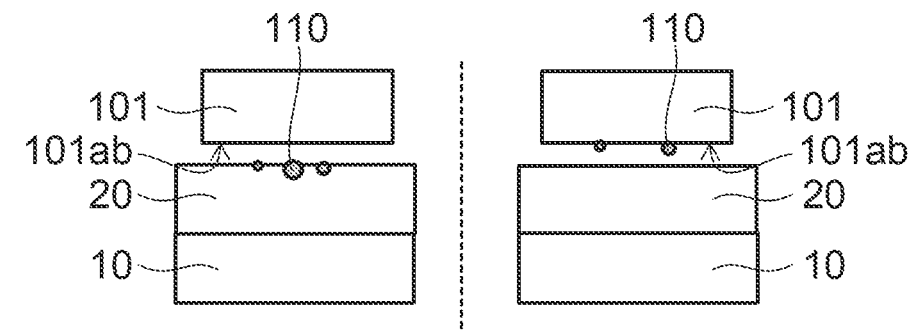

FIGS. 4A to 4C are schematic sectional views showing a cleaning method according to the reference example.

On the left and the right of each of FIGS. 4A to 4C, a region A and a region B in which regions of an adsorption face are different are shown.

In the reference example, the adhesive layer 20 is provided over the entire region of the rear surface of the electrostatic chuck cleaner and the conductive layer 30 is not provided. Therefore, the electrostatic chuck cleaner is not adsorbed by the electrostatic chuck 101. Therefore, in the reference example, the electrostatic chuck cleaner is pressed against the adsorption face 101ab of the electrostatic chuck 101 by the base plate 100 to attempt contact of the adhesive layer 20 and the adsorption face 101ab.

However, the gap 100sp is present between the base plate 100 and the electrostatic chuck cleaner. Therefore, the electrostatic chuck cleaner is not pressed against the adsorption face 101ab with a uniform pressing force. That is, the substrate 10 is bent by the own weight of the substrate 10. The region A where the adhesive layer 20 comes into contact with the adsorption face 101ab and the region B where the adhesive layer 20 does not come into contact with the adsorption face 101ab are formed.

In the region A, the adhesive layer 20 comes into contact with the adsorption face 101ab (FIG. 4B) to which the foreign matters 110 adhere (FIG. 4A). The foreign matters 110 adhering to the adsorption face 101ab are removed by the adhesive layer 20 (FIG. 4C).

However, in the region B, the foreign matters 110 adhering to the adsorption face 101ab (FIG. 4A) remain on the adsorption face 101ab (FIG. 4C) because the adhesive layer 20 does not come into contact with the adsorption face 101ab (FIG. 4B).

As described above, in the reference example, the foreign matters 110 adhering to a part of the adsorption face 101ab of the electrostatic chuck 101 cannot be removed.

Figure 5A:
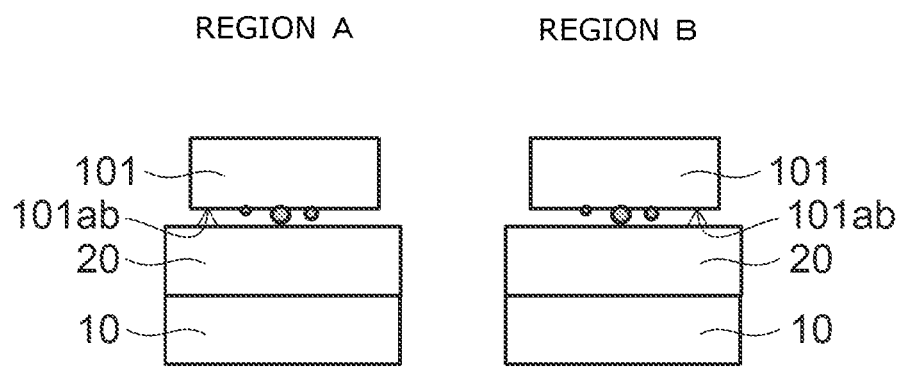
FIGS. 5A to 5C are schematic sectional views showing a state in which foreign matters are removed from the electrostatic chuck adsorption face in a cleaning method according to the first embodiment.
Figure 5B:
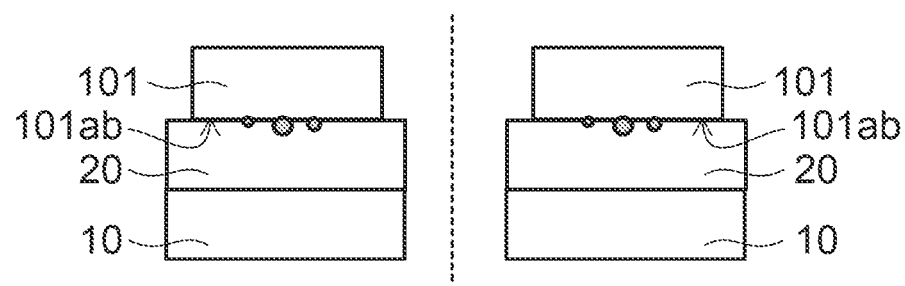
Figure 5C:
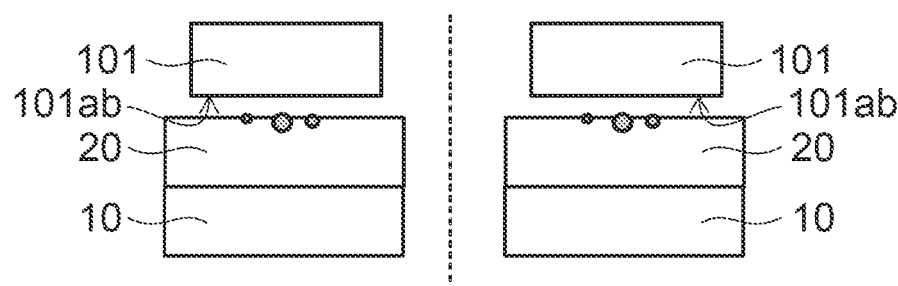

FIGS. 5A to 5C are schematic sectional views showing a state in which foreign matters are removed from the electrostatic chuck adsorption face in a cleaning method according to the first embodiment.

In the electrostatic chuck cleaner 1, the conductive layers 30 are provided on the major surfaces 10as and 10bs thereof. Therefore, even if the gap 100sp is present, the electrostatic chuck cleaner 1 is pressed against the adsorption face 101ab with a uniform force. That is, the bend of the substrate 10 due to the own weight of the substrate 10 is suppressed. Therefore, in any two regions A and B, the adhesive layers 20 come into contact with the adsorption face 101ab.

Consequently, the adhesive layer 20 comes into contact with the adsorption face 101ab (FIG. 5B) to which the foreign matters 110 adhere (FIG. 5A) in the regions A and B. The foreign matters 110 adhering to the adsorption face 101ab are removed by the adhesive layer 20 (FIG. 5C).

By using the electrostatic chuck cleaner 1, it is unnecessary to open the exposure apparatus to the atmosphere. Therefore, the operating ratio of the EUV exposure does not decrease.

Variation of the First Embodiment

A surface where the adhesive layer 20 comes into contact with the adsorption face 101ab of the electrostatic chuck 101 does not always need to be flat.

Figure 6A:
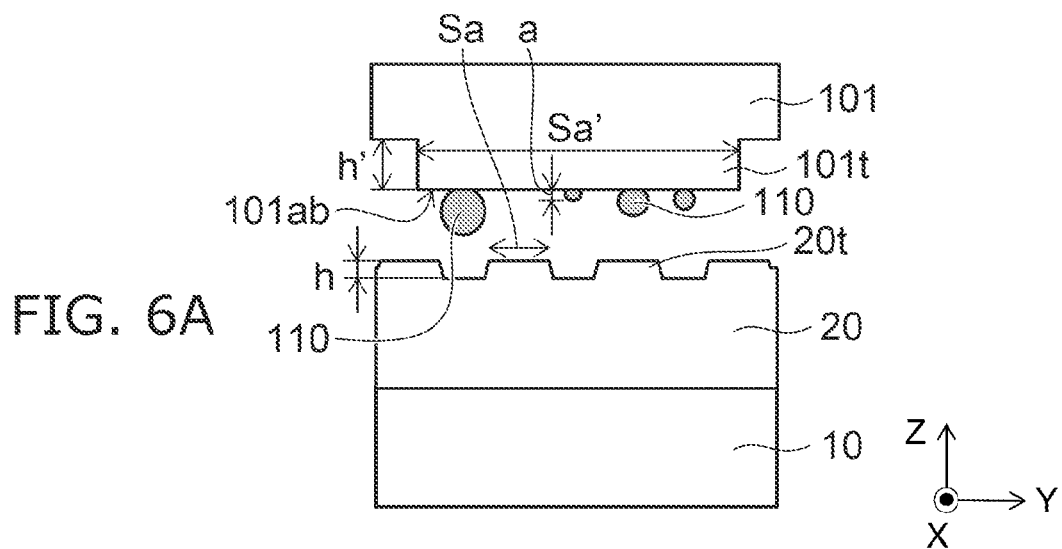
FIGS. 6A to 6C are schematic sectional views showing a cleaning method according to a variation of the first embodiment.
Figure 6B:
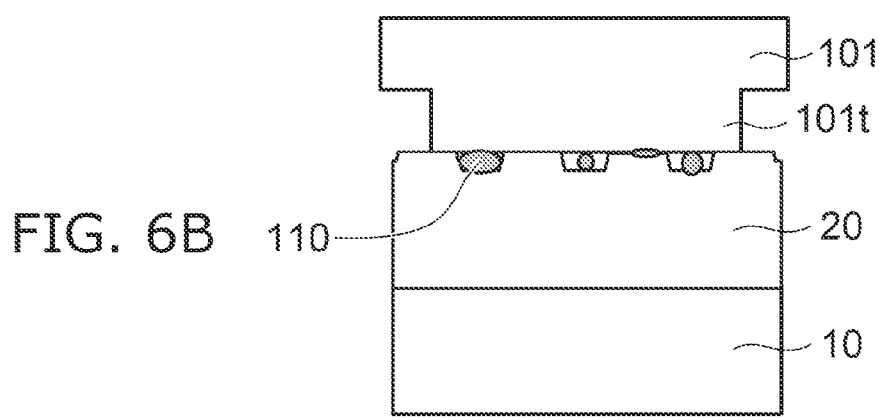
Figure 6C:
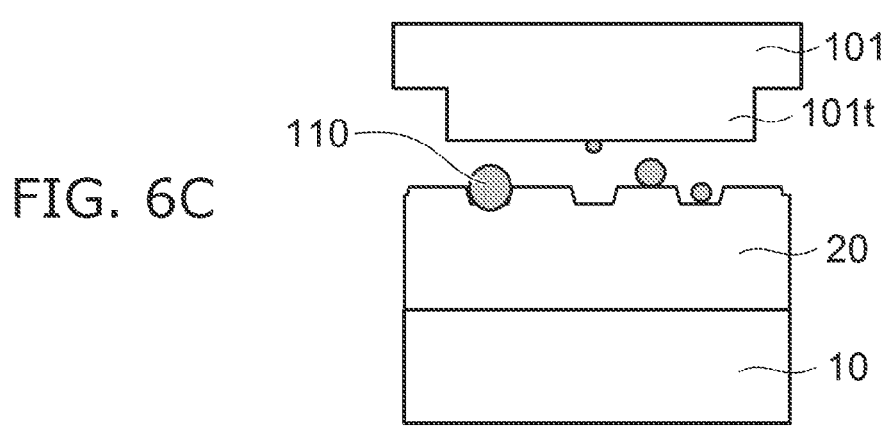

FIGS. 6A to 6C are schematic sectional views showing a cleaning method according to a variation of the first embodiment.

Unevenness may be formed on the surface of the adhesive layer 20 (the first adhesive layer section 20a and the second adhesive layer section 20b).

For example, as shown in FIG. 6A, a plurality of convex sections 20t are provided on the surface of the adhesive layer 20. Unevenness is sometimes formed on a surface where the electrostatic chuck 101 is opposed to the electrostatic chuck cleaner 1. In FIG. 6A, a state is shown in which a convex section 101t of the electrostatic chuck 101 is the adsorption face 101ab of the electrostatic chuck 101.

A surface area Sa of the convex section 20t of the adhesive layer 20 is smaller than a surface area Sa' of the convex section 101t of the electrostatic chuck 101. Height h of the convex section 20t is, for example, 10 μm or less. The height h of the convex section 20t comes to be slightly smaller when the adhesive layer 20 is pressed against the adsorption face 101ab. Height h' of the convex section 101t is, for example, 10 μm. In the figure, "a" means the height of the foreign matters 110 from the adsorption face 101ab.

Subsequently, as shown in FIG. 6B, the adhesive layer 20 is brought into contact with the electrostatic chuck 101. When adhesive layer 20 is brought into contact with the electrostatic chuck 101, since the surface area Sa of each of the plurality of convex sections 20t is smaller than the surface area Sa' of the convex section 101t of the electrostatic chuck 101, the convex sections 20t of the adhesive layer 20 come into contact with the adsorption face 101ab of the convex section 101t of the electrostatic chuck 101.

Since the height h of the convex section 20t is 10 μm or less, the foreign matters 110, the height "a" of which from the adsorption face 101ab is 10 μm or more, come into contact with the adhesive layer 20. Therefore, the foreign matters 110, the height "a" of which from the adsorption face 101ab is 10 μm or more, are surely removed by the adhesive layer 20 as shown in FIG. 6C.

With the electrostatic chuck cleaner 1, for example, when the voltage application to the electrostatic chuck 101 shown in FIG. 2G is stopped, the electrostatic chuck cleaner 1A (1B) easily separates from the electrostatic chuck 101 with the own weight of the electrostatic chuck cleaner 1A (1B). This is because a contact area between the adhesive layer 20 and the adsorption face 101ab is reduced by the formation of the surface unevenness.

In the variation of the first embodiment, an adhesive force of the adhesive layer 20 is adjusted to be smaller than the own weight of the electrostatic chuck cleaner 1A (1B) by adjusting the contact area between the adhesive layer 20 and the adsorption face 101ab or the adhesive force of the adhesive layer 20.

The foreign matters 110, the height "a" of which from the adsorption face 101ab is smaller than 10 μm, are minute foreign matters. Even if the minute foreign matters 110 remain on the adsorption face 101ab of the electrostatic chuck 101, the minute foreign matters 110 do not affect the bend of the electrostatic chuck cleaner 1A (1B).

Second Embodiment

A region where an adhesive layer is formed may have any shape. For example, another example is shown in FIG. 7.

Figure 7:
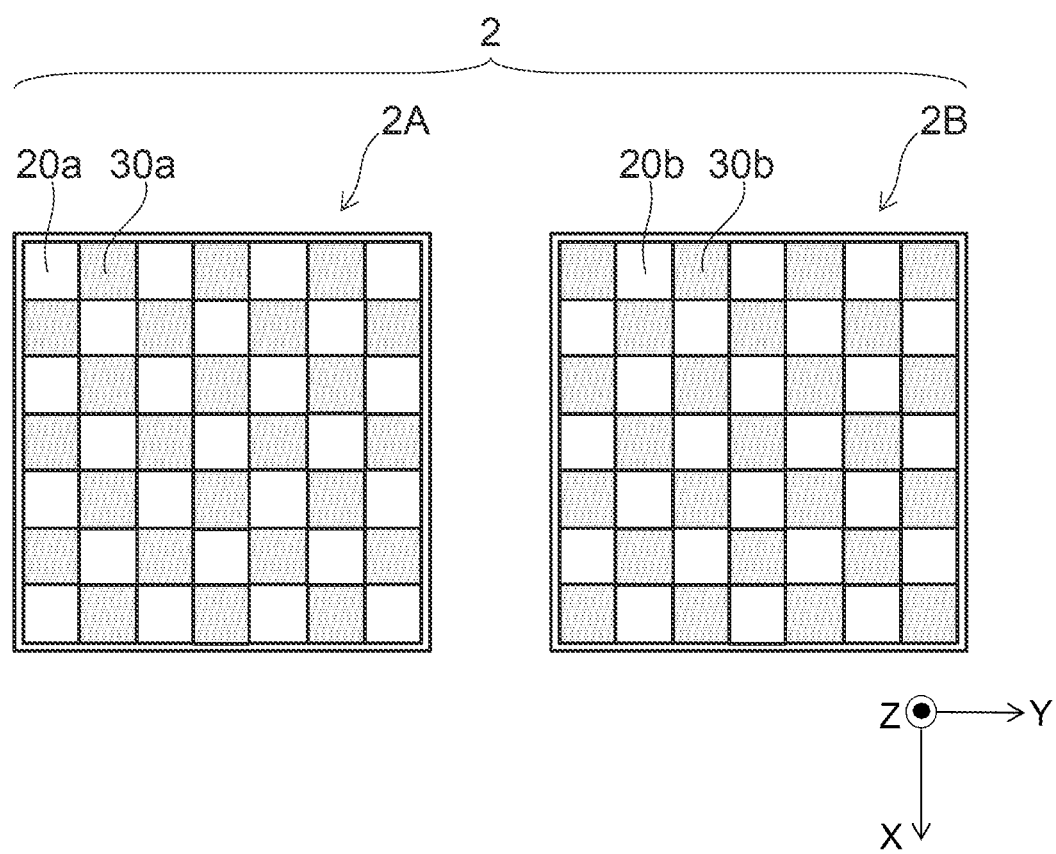
FIG. 7 is a schematic plan view showing an electrostatic chuck cleaner according to a second embodiment.

FIG. 7 is a schematic plan view showing an electrostatic chuck cleaner according to a second embodiment.

In FIG. 7, major surfaces viewed from the Z-direction of the electrostatic chuck cleaner 2 (the pair of electrostatic chuck cleaners 2A and 2B) are shown.

In the electrostatic chuck cleaner 2A, the first adhesive layer sections 20a and the first conductive layer sections 30a are alternately arrayed in the X direction and the Y direction.

In the electrostatic chuck cleaner 2B, the second adhesive layer sections 20b and the second conductive layer sections 30b are alternately arrayed in the X1 direction and the Y direction.

Even in such an arrangement of the adhesive layer sections and the conductive layer sections, when the electrostatic chuck cleaners 2A and 2B are pressed against the adsorption face of the electrostatic chuck one by one, the entire adsorption face comes into contact with the adhesive layers.

Third Embodiment

Figure 8:
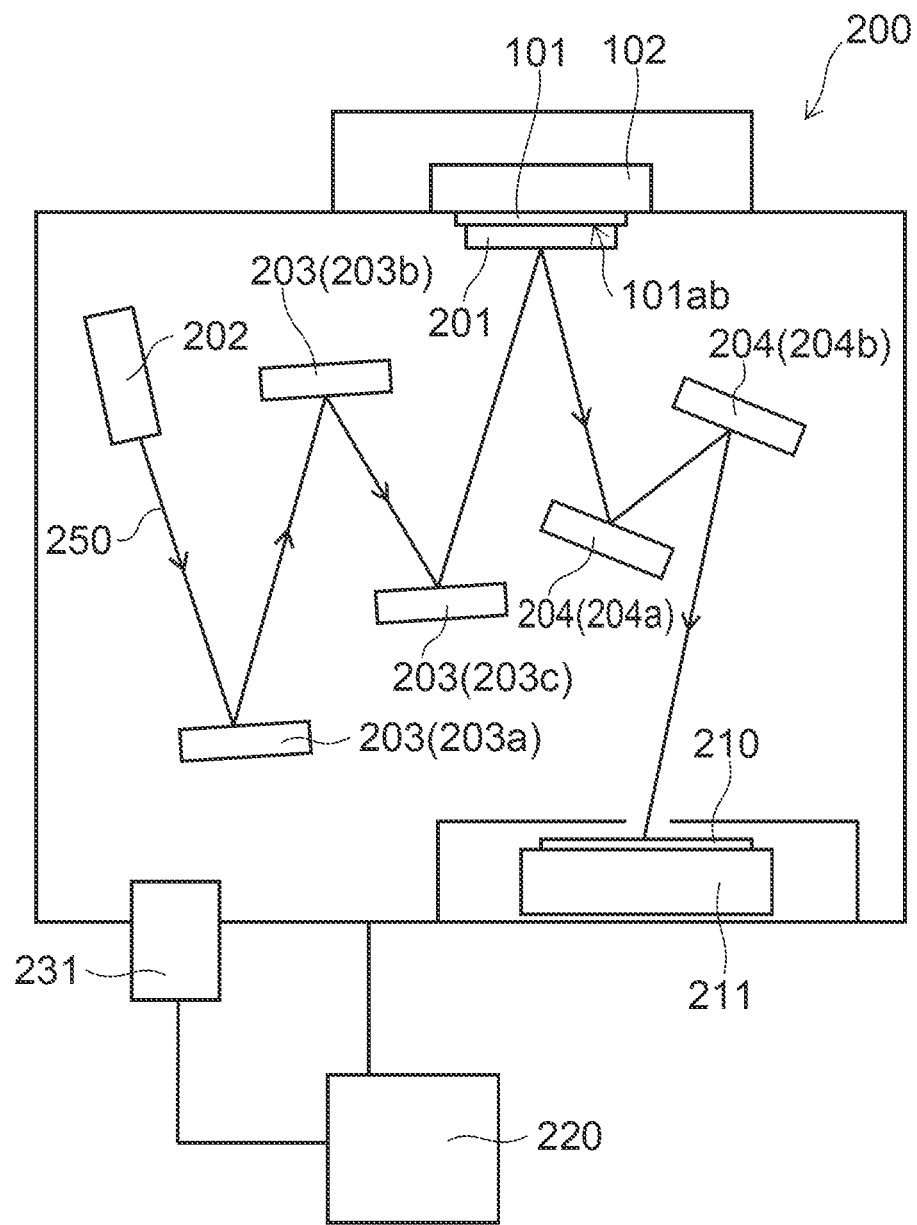
FIG. 8 is a schematic view showing an exposure apparatus according to a third embodiment.

FIG. 8 is a schematic view showing an exposure apparatus according to a third embodiment.

The electrostatic chuck cleaners 1 and 2 are conveyed into an exposure apparatus 200 shown in FIG. 8 in the same manner as a reticle. The electrostatic chuck cleaners 1 and 2 come into contact with the adsorption face 101ab of the electrostatic chuck 101. Thus, cleaning is performed to the adsorption face 101ab of the electrostatic chuck 101. In the figure, a reticle 201 is shown. The reticle 201 is replaced with the electrostatic chuck cleaners 1 and 2.

The exposure apparatus 200 uses, as exposure light 250, EUV light having a wavelength of approximately 3 to 50 nm (approximately 100 nm or less). The exposure apparatus 200 includes a light source 202 that emits exposure light, an illumination optical system 203 (203a, 203b, and 203c) that illuminates the reticle 201, the stage 102 that supports the electrostatic chuck 101 and moves the reticle 201, and a projection optical system 204 (204a and 204b) that projects a pattern image (reflected light) reflected from the reticle 201 on a semiconductor wafer 210 applied with a resist.

The exposure apparatus 200 includes a wafer stage 211 that moves the semiconductor wafer 210 and a control device 220 that collectively controls the operation of the apparatus.

To prevent absorption of the EUV light by the atmosphere, the exposure apparatus 200 is housed in a vacuum tank 230. A vacuum state is maintained in the vacuum tank 230 by an exhaust system 231.

By applying the electrostatic sequence to the plurality of cleaner masks respectively having the different forming regions of the adhesive layers in this way, it is possible to attract the cleaners to the reticle chuck of the exposure apparatus in the electrostatic chuck sequence same as the electrostatic chuck sequence for the normal reticle. Therefore, it is possible to efficiently remove foreign matters from the electrostatic chuck surface. Further, by forming the surface of the adhesive layers in the uneven shape, it is possible to improve separation performance of the reticle chuck cleaners from the electrostatic chuck in separation from the electrostatic chuck.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electrostatic chuck cleaner cleaning an adsorption face of an electrostatic chuck capable of attracting a reticle, and the cleaner comprising:
   a plurality of substrates;
   adhesive layers provided on a major surface of each of the substrates, the adhesive layers being pressed against the adsorption face; and
   conductive layers provided on the major surface of each of the substrates, and the conductive layers being provided in a region other than a region where the adhesive layer being provided, the adhesive layers provided on the major surface of each of the substrates being disposed in different regions, and the entire adsorption face being pressed by the adhesive layers when the adhesive layers of the substrates being pressed against the adsorption face, wherein the plurality of substrates comprises a pair of substrates and includes:

first adhesive layer sections provided in first regions of a major surface of one substrate of the pair of substrates;

first conductive layer sections provided in second regions other than the first regions of the major surface of the one substrate of the pair of substrates;

second conductive layer sections provided in first regions of a major surface of the other substrate of the pair of substrates; and second adhesive layer sections provided in second regions other than the first regions of the major surface of the other substrate of the pair of substrates.

2. The cleaner according to claim 1, wherein the first adhesive layer sections and the first conductive layer sections extend in a first direction, the first adhesive layer sections and the first conductive layer sections are alternately arrayed in a second direction crossing the first direction, the second adhesive layer sections and the second conductive layer sections extend in the first direction, and the second adhesive layer sections and the second conductive layer sections are alternately arrayed in the second direction crossing the first direction.

3. The cleaner according to claim 2, wherein unevenness is provided on surfaces of the first adhesive layer sections and surfaces of the second adhesive layer sections.

4. The cleaner according to claim 1, wherein the first adhesive layer sections and the first conductive layer sections are alternately arrayed in a first direction, the first adhesive layer sections and the first conductive layer sections are alternately arrayed in a second direction that crosses the first direction, the second adhesive layer sections and the second conductive layer sections are alternately arrayed in the first direction, and the second adhesive layer sections and the second conductive layer sections are alternately arrayed in the second direction that crosses the first direction.

5. The cleaner according to claim 4, wherein unevenness is provided on surfaces of the first adhesive layer sections and surfaces of the second adhesive layer sections.

6. The cleaner according to claim 1, wherein unevenness is provided on surfaces of the first adhesive layer sections and surfaces of the second adhesive layer sections.

7. A cleaning method for cleaning an adsorption face of an electrostatic chuck capable of absorbing a reticle by pressing an electrostatic chuck cleaner against the adsorption face, and the cleaner includes:

a plurality of substrates;

adhesive layers provided on a major surface of each of the substrates, the adhesive layers being pressed against the adsorption face; and conductive layers provided on the major surface of each of the substrates, and the conductive layers being provided in a region other than a region where the adhesive layer being provided, the adhesive layers provided on the major surface of each of the substrates being disposed in different regions, and the entire adsorption face being pressed by the adhesive layers when the adhesive layers of the substrates being pressed against the adsorption face, wherein the plurality of substrates comprises a pair of substrates and includes:

first adhesive layer sections provided in first regions of a major surface of one substrate of the pair of substrates;

first conductive layer sections provided in second regions other than the first regions of the major surface of the one substrate of the pair of substrates;

second conductive layer sections provided in first regions of a major surface of the other substrate of the pair of substrates; and second adhesive layer sections provided in second regions other than the first regions of the major surface of the other substrate of the pair of substrates.

8. The method according to claim 7, wherein the first adhesive layer sections and the first conductive layer sections extend in a first direction, the first adhesive layer sections and the first conductive layer sections are alternately arrayed in a second direction crossing the first direction, the second adhesive layer sections and the second conductive layer sections extend in the first direction, and the second adhesive layer sections and the second conductive layer sections are alternately arrayed in the second direction crossing the first direction.

9. The method according to claim 8, wherein unevenness is provided on surfaces of the first adhesive layer sections and surfaces of the second adhesive layer sections.

10. The method according to claim 7, wherein the first adhesive layer sections and the first conductive layer sections are alternately arrayed in a first direction, the first adhesive layer sections and the first conductive layer sections are alternately arrayed in a second direction crossing the first direction, the second adhesive layer sections and the second conductive layer sections are alternately arrayed in the first direction, and the second adhesive layer sections and the second conductive layer sections are alternately arrayed in the second direction crossing the first direction.

11. The method according to claim 10, wherein unevenness is provided on surfaces of the first adhesive layer sections and surfaces of the second adhesive layer sections.

12. The method according to claim 7, wherein unevenness is provided on surfaces of the first adhesive layer sections and surfaces of the second adhesive layer sections.

13. An exposure apparatus comprising:

a light source that emits exposure light;

an electrostatic chuck cleaner cleaning an adsorption face of an electrostatic chuck capable of attracting a reticle, and the cleaner including: a plurality of substrates; adhesive layers provided on a major surface of each of the substrates, the adhesive layers being pressed against the adsorption face; and conductive layers provided on the major surface of each of the substrates, and the conductive layers being provided in a region other than a region where the adhesive layer being provided, the adhesive layers provided on the major surface of each of the substrates being disposed in different regions, and the entire adsorption face being pressed by the adhesive layers when the adhesive layers of the substrates being pressed against the adsorption face;
an illumination optical system that illuminates the reticle with the exposure light; and
a projection optical system that projects reflected light reflected from the reticle on a semiconductor wafer,
wherein the plurality of substrates comprises a pair of substrates and includes:
  first adhesive layer sections provided in first regions of a major surface of one substrate of the pair of substrates;
  first conductive layer sections provided in second regions other than the first regions of the major surface of the one substrate of the pair of substrates;
  second conductive layer sections provided in first regions of a major surface of the other substrate of the pair of substrates; and
  second adhesive layer sections provided in second regions other than the first regions of the major surface of the other substrate of the pair of substrates.

14. The apparatus according to claim 13, wherein
the first adhesive layer sections and the first conductive layer sections extend in a first direction,
the first adhesive layer sections and the first conductive layer sections are alternately arrayed in a second direction that crosses the first direction,
the second adhesive layer sections and the second conductive layer sections extend in the first direction, and
the second adhesive layer sections and the second conductive layer sections are alternately arrayed in the second direction that crosses the first direction.

15. The apparatus according to claim 14, wherein unevenness is provided on surfaces of the first adhesive layer sections and surfaces of the second adhesive layer sections.

16. The apparatus according to claim 13, wherein
the first adhesive layer sections and the first conductive layer sections are alternately arrayed in a first direction,
the first adhesive layer sections and the first conductive layer sections are alternately arrayed in a second direction crossing the first direction,
the second adhesive layer sections and the second conductive layer sections are alternately arrayed in the first direction, and
the second adhesive layer sections and the second conductive layer sections are alternately arrayed in the second direction crossing the first direction.

17. The apparatus according to claim 13, wherein unevenness is provided on surfaces of the first adhesive layer sections and surfaces of the second adhesive layer sections.

* * * * *